US010361186B1

(12) United States Patent
Langguth

(10) Patent No.: US 10,361,186 B1
(45) Date of Patent: Jul. 23, 2019

(54) SUPPRESSION OF PARASITIC DISCHARGE PATH IN AN ELECTRICAL CIRCUIT

(71) Applicant: Infineon Technologies AG, Neubiberg (DE)

(72) Inventor: Gernot Langguth, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/891,133

(22) Filed: Feb. 7, 2018

(51) Int. Cl.
*H01L 27/00* (2006.01)
*H01L 27/02* (2006.01)
*H01L 27/06* (2006.01)
*H02M 1/00* (2006.01)

(52) U.S. Cl.
CPC ...... *H01L 27/0262* (2013.01); *H01L 27/0248* (2013.01); *H01L 27/0255* (2013.01); *H01L 27/0635* (2013.01); *H02M 2001/0038* (2013.01)

(58) Field of Classification Search
CPC .................. H01L 27/0262; H01L 27/0255
See application file for complete search history.

(56) References Cited

U.S. PATENT DOCUMENTS

| 7,064,392 B1 * | 6/2006 | Morishita ....... H01L 21/823425 257/355 |
| 2001/0025963 A1 * | 10/2001 | Tashiro ................... H01L 21/84 257/173 |
| 2007/0284665 A1 * | 12/2007 | Nagai ................. H01L 27/0262 257/357 |
| 2010/0006890 A1 * | 1/2010 | Wijmeersch ........ H01L 27/0262 257/140 |
| 2010/0090283 A1 * | 4/2010 | Langguth ............ H01L 27/0262 257/355 |
| 2011/0157754 A1 * | 6/2011 | Nagai ................. H01L 27/0259 361/56 |
| 2013/0341675 A1 * | 12/2013 | Lai ....................... H01L 27/0262 257/147 |
| 2013/0341676 A1 * | 12/2013 | Lee .......................... H01L 29/73 257/148 |
| 2013/0341730 A1 | 12/2013 | Domanski |
| 2014/0061803 A1 * | 3/2014 | Chang ................. H01L 27/0277 257/355 |
| 2016/0163690 A1 * | 6/2016 | Ko ....................... H01L 27/0262 257/133 |

* cited by examiner

*Primary Examiner* — Ahmed N Sefer
(74) *Attorney, Agent, or Firm* — Shumaker & Sieffert, P.A.

(57) ABSTRACT

In some examples, a device includes a first power supply node, an input-output node, and a second power supply node positioned between the first power supply node and the input-output node. The device also includes a protection element configured to block a parasitic flow of carriers between the first power supply node and the input-output node, wherein the parasitic flow of carriers is based on a voltage level of the second power supply node.

20 Claims, 16 Drawing Sheets

SUPPRESSION OF PARASITIC DISCHARGE PATH IN AN ELECTRICAL CIRCUIT

TECHNICAL FIELD

This disclosure relates to semiconductor devices.

BACKGROUND

During an electrostatic discharge event, a semiconductor device may experience a current pulse at a supply rail or an input-output node. The current pulse may cause the parasitic flow of carriers (e.g., electrons and/or holes) through a bipolar structure in the semiconductor device instead of the primary electrostatic discharge (ESD) discharge path. The parasitic flow through the bipolar structure may result in damage to the semiconductor device.

SUMMARY

This disclosure describes techniques for suppressing or blocking the parasitic flow through a bipolar structure of a semiconductor device. The parasitic flow may be caused by a current pulse at a power supply node or an input-output node during, for example, an electrostatic discharge (ESD) event. The current pulse may cause the parasitic flow through the bipolar structure. To prevent the parasitic flow, the semiconductor device may include a protection element electrically connected in series with the parasitic flow. For example, the protection element may be configured to block parasitic flow by allowing the flow of carriers in the opposite direction of the flow of carriers allowed by the bipolar structure.

In some examples, a device includes a first power supply node, an input-output node, and a second power supply node positioned between the first power supply node and the input-output node. The device also includes a protection element configured to block a parasitic flow of carriers between the first power supply node and the input-output node, wherein the parasitic flow of carriers is based on a voltage level of the second power supply node.

In some examples, a method includes forming a p-type substrate, forming a p-well on the p-type substrate, and forming an n-well adjacent to the p-well on the p-type substrate. The method also includes forming a first power supply node on the n-well, wherein forming the first power supply node comprises forming p-type material on the n-well. The method further includes forming a second power supply node on the p-well, wherein forming the second power supply node comprises forming p-type material on the p-well. The method includes forming an input-output node on the p-well, wherein forming the input-output node comprises forming n-type material on the p-well.

The details of one or more examples are set forth in the accompanying drawings and the description below. Other features, objects, and advantages will be apparent from the description and drawings, and from the claims.

DETAILED DESCRIPTION

This disclosure describes devices, methods, and techniques for blocking or impeding the parasitic flow of electricity between an input-output node and a power supply node. The parasitic flow may occur during a current pulse at the input-output node caused by, for example, an electrostatic discharge (ESD) event. In some examples, the structure of a device may allow the parasitic flow of carriers, which may flow through a low-impedance path created by a bipolar structure in the device. The low impedance of the parasitic structure during an ESD event may result in high electrical currents, which may damage the device.

To prevent the parasitic flow between the input-output node and the power supply node, the device may include a protection element, such as a p-n diode, a metal-oxide-semiconductor (MOS) transistor, and/or a bipolar transistor. The protection element may be configured to block the parasitic flow or carriers during an ESD event. The protection element and the structure of the device may cause the carriers to not flow through the parasitic structure or to flow between the input-output node and another power supply node, which may reduce the damage to the device.

Figure 1:
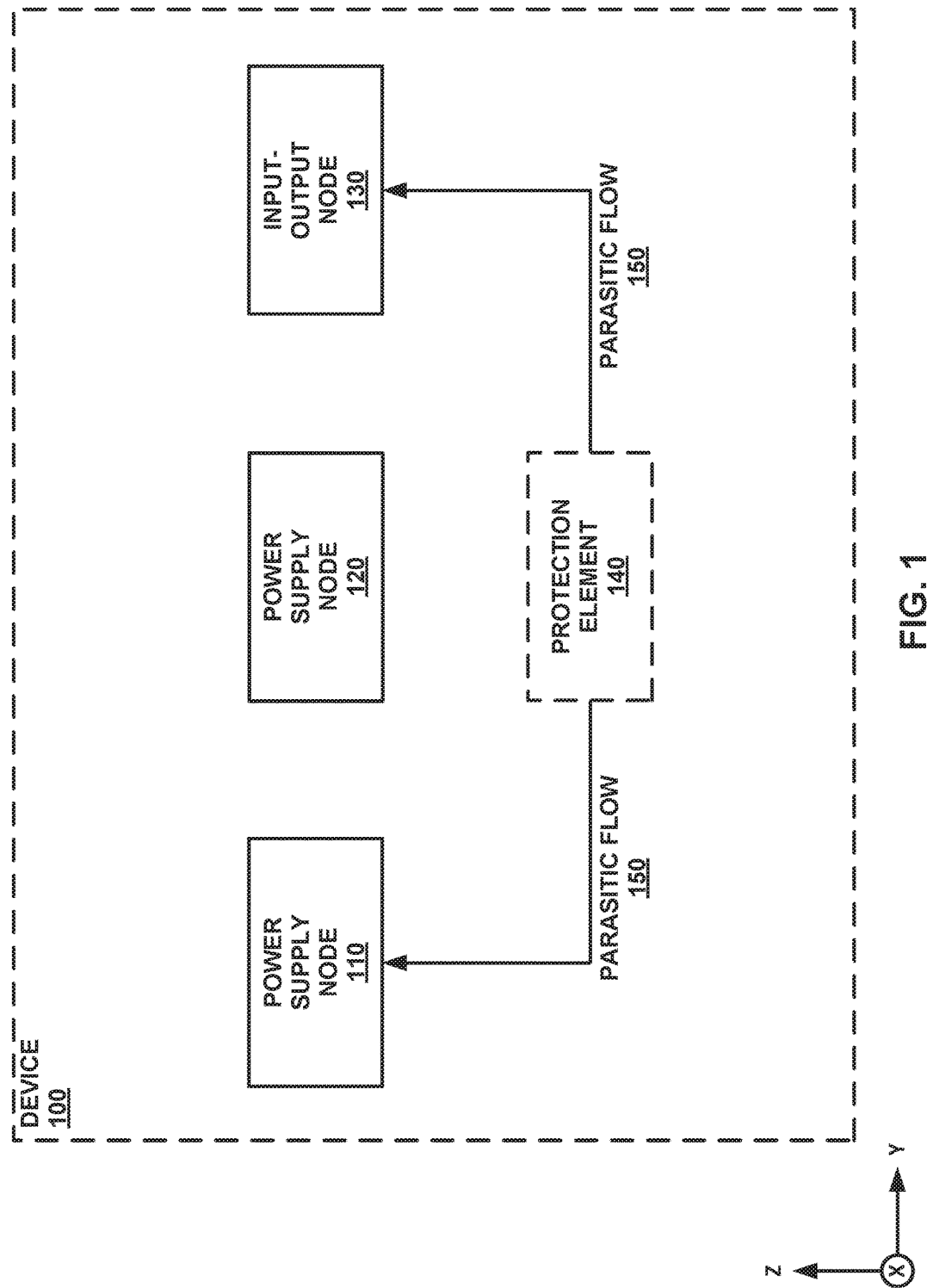
FIG. 1 is a conceptual block diagram illustrating a device including a protection element configured to block parasitic flow between a power supply node and an input-output node, in accordance with some examples of this disclosure.

Another design approach to prevent the parasitic flow of carriers is to increase the distance between the input-output node and the power supply node (e.g., nodes 110 and 130 in FIG. 1). This design approach increases the total volume of the device, which may be undesirable for cost and form factor reasons. This design approach also reduces the collection efficiency of the power supply node with respect to latch-up conditions. In addition, this design approach cannot be applied for three-dimensional isolation schemes.

Another design approach includes a high-ohmic connection between the input-output node and the power supply node. For example, the connection may have a resistance of more than one hundred ohms, but the collection efficiency of the power supply node may decrease with increasing resistance. Moreover, the latch-up risk becomes higher with increasing resistance.

A further design approach includes a Zener diode or an avalanche diode with a cathode connected to the input-output node. The anode of the diode may be connected to an intermediate power supply node with a different doping type than the input-output node. The parasitic flow of carriers is still possible between the input-output node and the similarly doped power supply node, but the parasitic flow is less likely, as compared to a device without a Zener diode or avalanche diode. This design approach will increase the size of the device due to the large footprint of the Zener diode. Further, the latch-up protection scheme will consume substantial area because the cathode of a Zener diode can be a deep electron emitter that is a long distance from the active circuitry of the device. Thus, using a protection element to block parasitic flow of carriers may result in cost savings and smaller volumes, as compared other designs.

The protection element may be useful in dealing with over-voltage shocks or under-voltage shocks. Over-voltage tolerance or under-voltage tolerance may be a major design consideration. The causes of over-voltages and under-voltages include noise cross-coupling and system supply sequence. In some examples, the system may not be able to necessarily prevent the high-side power supply from being ramped up before the voltage level of an input-output node is ramped up. Moreover, fewer components in a device can lead to a situation where the input-output node receives a voltage level that is much higher than the high-side power supply for a limited time. Robust and area-efficient over-voltage tolerant or under-voltage tolerant ESD and latch-up protection may increase the flexibility for system design and increase the value of the device to the customer.

FIG. 1 is a conceptual block diagram illustrating a device 100 including a protection element 140 configured to block parasitic flow 150 between a power supply node 110 and an input-output node 130, in accordance with some examples of this disclosure. Device 100 includes power supply nodes 110 and 120, input-output node 130, and protection element 140. Device 100, and any of the elements of device 100, may include semiconductor material such as silicon, germanium, gallium arsenide, gallium nitride, silicon carbine, and/or any other suitable semiconductor material. Device 100 may be configured to operate as a driver for power electronics circuitry in a variety of devices including computers, mobile devices, televisions, and/or electric motors.

Power supply nodes 110 and 120 may each be configured to receive a power supply, such as a high-side voltage supply (e.g., $V_{DD}$) or a low-side voltage supply (e.g., reference ground (GND), $V_{SS}$). Each of power supply nodes 110 and 120 may include highly doped semiconductor material, such as n+ material, or p+ material. In some examples, power supply node 110 may form a guard rail by wrapping around two or more sides of device 100. Power supply node 120 may wrap around input-output node 130 on two or more sides, as shown in FIG. 2C.

Power supply node 120 may be positioned between power supply node 110 and input-output node 130. Power supply node 120 may include highly doped semiconductor material of a different type than power supply node 110. For example, is power supply node 110 includes n+ material, power supply node 120 may include p+ material. The voltage level at power supply node 120 may affect the parasitic flow of electricity between nodes 110 and 130 through protection element 140. Electricity may flow between power supply node 110 and input-output node 130 through an intermediate region that is adjacent to power supply node 120. The electricity may include the flow of positive carriers (e.g., holes or the absence of electrons) and the flow of negative carriers (e.g., electrons).

Input-output node 130 may include or be electrically connected to a conductive region, such as an n+ region or a p+ region. The doping type of input-output node 130 may be the same as power supply node 110 and the opposite of the doping type power supply node 120. For example (see FIGS. 2A and 2B), each of nodes 110 and 130 may include n+ material, and power supply node 120 may include p+ material. In another example, each of nodes 110 and 130 may include p+ material, and power supply node 120 may include n+ material.

The structure of device 100 may allow parasitic flow between nodes 110 and 130 based on a parasitic n-p-n bipolar structure or a parasitic p-n-p bipolar structure. If an electrostatic discharge (ESD) current pulse occurs at input-output node 130, positive carriers may flow, via parasitic flow 150, from input-output node 130 to power supply node 110 based on the voltage level of power supply node 120. However, it may be desirable to have the positive carriers instead flow from input-output node 130 to power supply node 120.

In accordance with the techniques of this disclosure, protection element 140 may be configured to block parasitic flow 150 of carriers between power supply node 110 and input-output node 130. Protection element 140 may include a p-n diode, a MOS transistor, a p-n-p bipolar transistor, and/or n-p-n bipolar transistor. Protection element 140 may include an element that is integrated in device 100 and/or an element that is externally connected to power supply node 110 or input-output node 130. Protection element 140 may block parasitic flow 150 and thereby prevent damage to device 100 that can be caused by ESD events.

Protection element 140 may be a bi-directional element that is positioned between nodes 110 and 130. Protection element 140 may have high resistivity (e.g., more than one hundred kiloohms) for positive bias between nodes 110 and 130 for at least one microsecond, which is approximately the duration of an ESD event, to suppress parasitic flow 150 during the ESD event. Positive bias may represent the flow of positive carriers from input-output node 130 to power supply node 110 for an example where nodes 110 and 130 include n+ material.

Protection element 140 may also have a high-breakdown voltage (BV) for positive bias between nodes 110 and 130, where the BV of protection element 140 is greater than the clamping voltage of an intended ESD path minus a holding voltage of parasitic flow 150 through a parasitic bipolar structure. The intended ESD path may be for positive carriers to flow from input-output node 130 to power supply node 120 and then to power supply node 110. Protection element 140 may have low resistivity of less than ten ohms for negative bias between nodes 110 and 130 for direct-current (DC) operation to guarantee latch-up protection functionality for input-output node 130. The design of device 100 may be applied where each of nodes 110 and 130 includes p+ material.

Parasitic flow 150 may be the flow of electricity through device 100 that is not intended during the operation of device 100. Parasitic flow 150 may be based on the parasitic capacitance between nodes 110 and 120 and the parasitic capacitance between nodes 120 and 130. Nodes 110, 120, and 130 may form a bipolar parasitic structure that allows parasitic flow 150 when, for example, input-output node 130 experiences an ESD current pulse. In some examples, nodes 110 and 130 may include n-regions that form the end terminals or load terminals of an n-p-n bipolar parasitic structure. The flow of carriers through the n-p-n bipolar parasitic structure may be based on the voltage level of node 120.

Figure 6A:
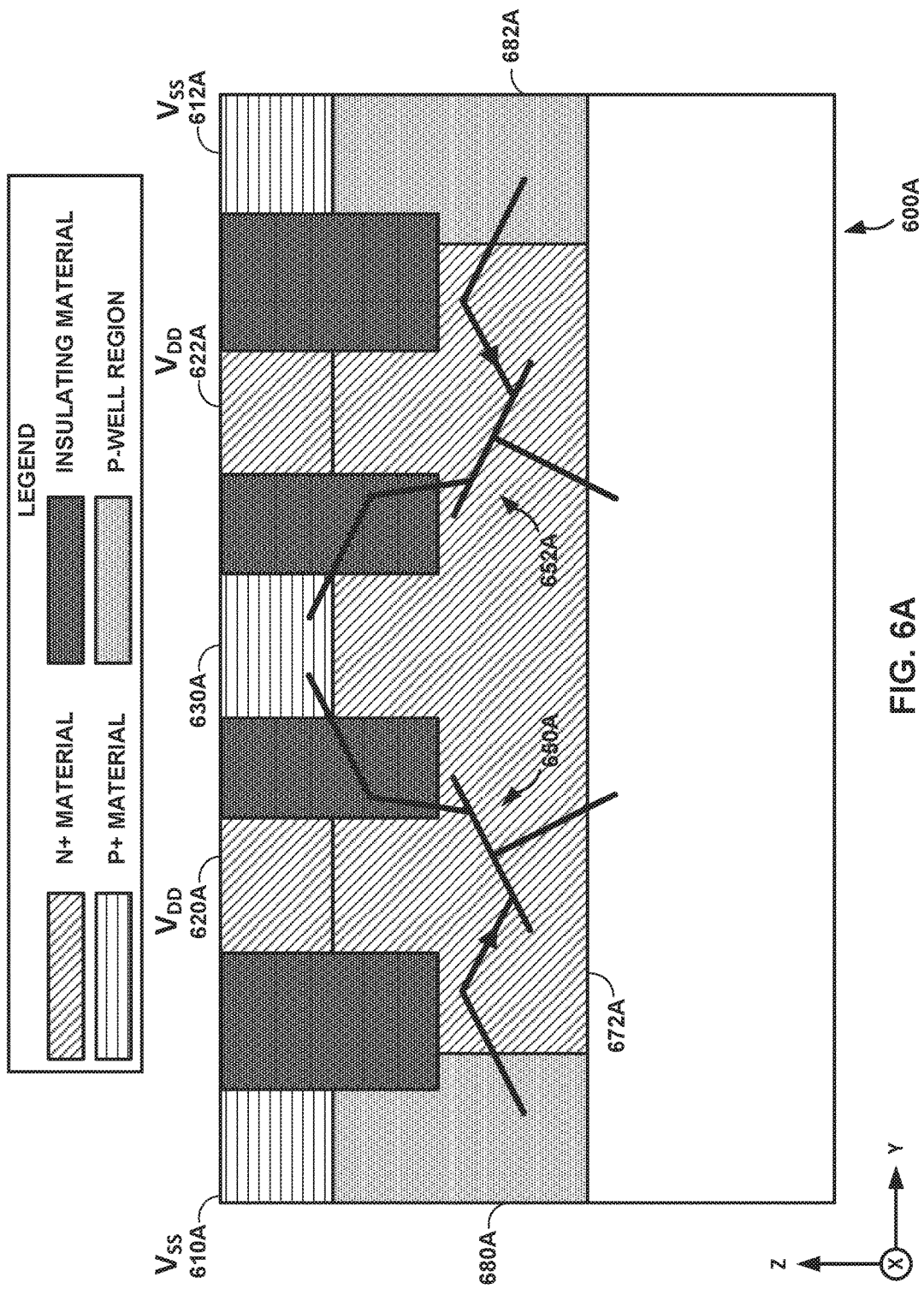
FIG. 6A illustrates a semiconductor device with parasitic flow between an input-output node and a power supply node, in accordance with some examples of this disclosure.

Although nodes 110, 120, and 130 are described as single elements, each of nodes 110, 120, and 130 may include several elements or materials. For example, power supply node 110 may include an n+ material as shown in FIGS. 2A-2C, 3A, and 8 and/or a metal conductive material such as solder, copper, aluminum, and/or gold that is electrically connected to the n+ material. Additionally or alternatively, power supply node 110 may include a p+ material as shown in FIGS. 4, and 6A.

Figure 2A:
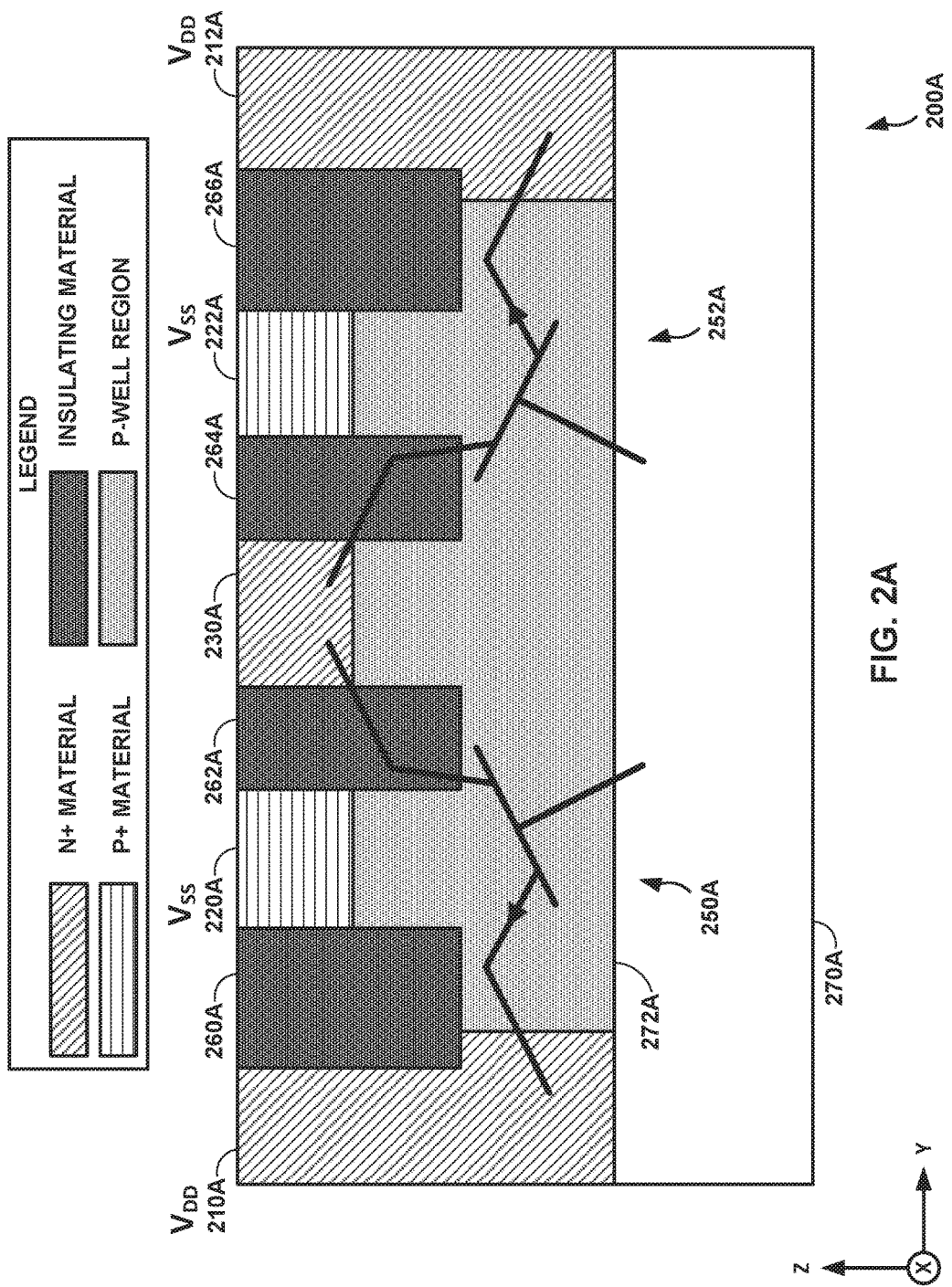
FIGS. 2A-2C illustrate semiconductor devices with parasitic flow between an input-output node and one or more power supply nodes, in accordance with some examples of this disclosure.
Figure 2B:
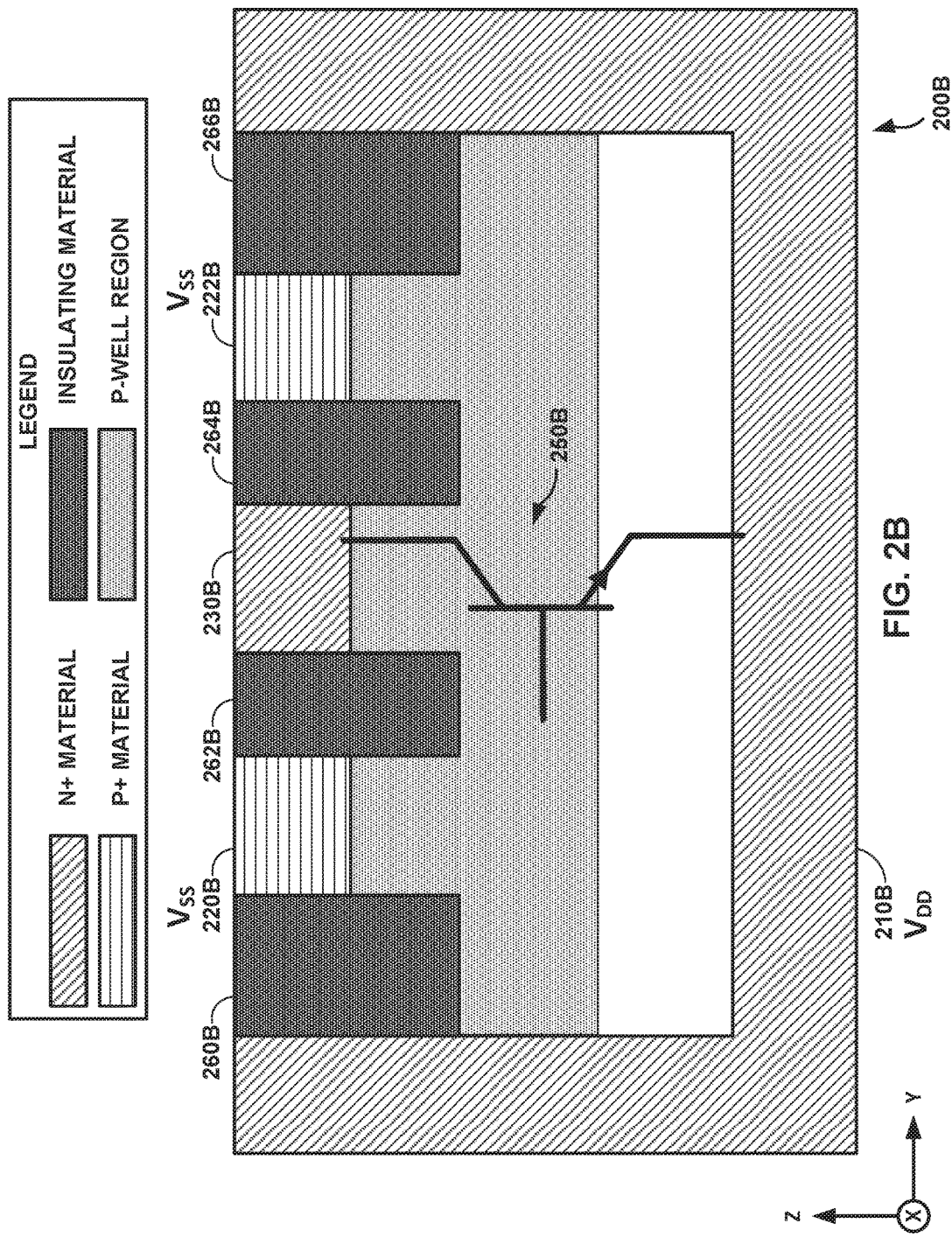
Figure 2C:
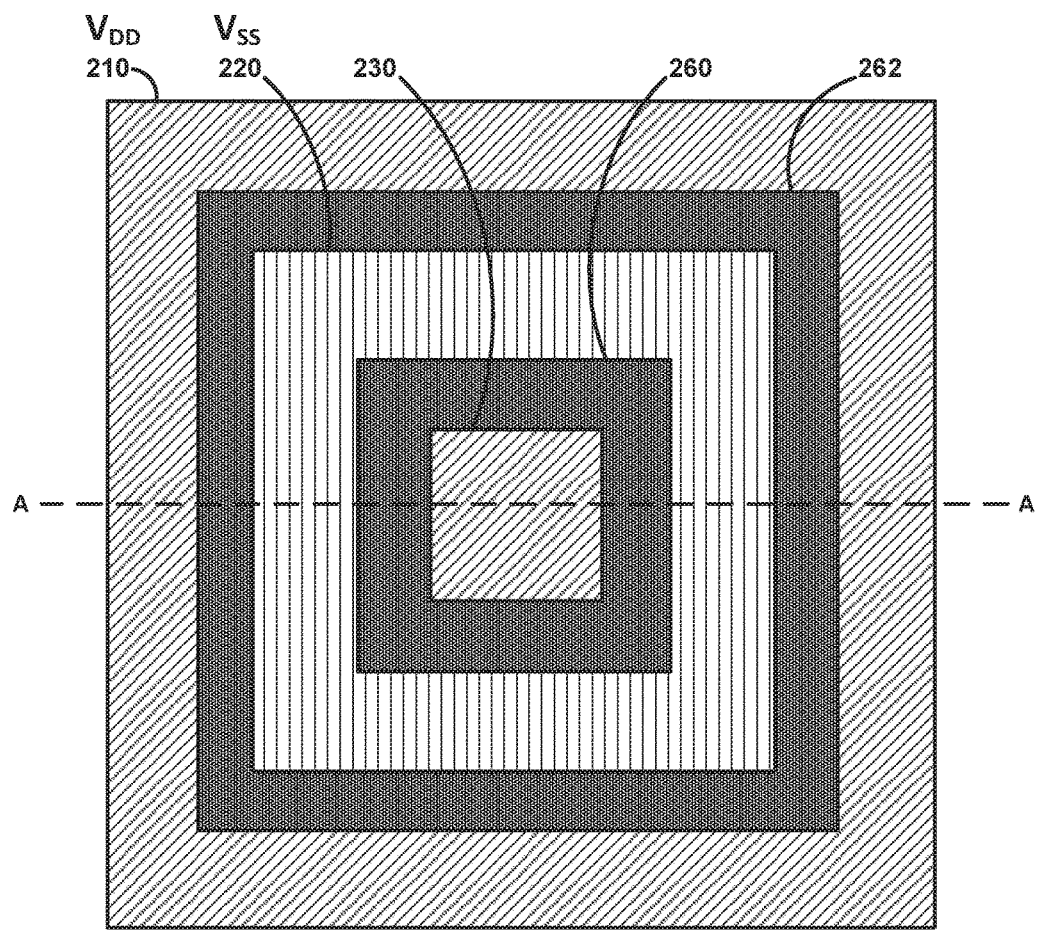

FIGS. 2A-2C illustrate semiconductor devices with parasitic flow between an input-output node and one or more power supply nodes, in accordance with some examples of this disclosure. The semiconductor devices of FIGS. 2A-2C are described as having n-diffusion regions positioned on the outside of the device. However, the techniques of this disclosure also apply to semiconductor devices including p-diffusion regions positioned on the outside of the device (see, e.g., FIGS. 6A and 8).

Device 200A may include oxide layers 260A, 262A, 264A, and 266A to electrically isolate nodes 210A, 212A, 220A, 222A, and 230A. Device 200A may also include p-well 270A and lightly doped p-region 272A. Power supply node 220A, region 270A, and/or region 272A may operate as a base of parasitic bipolar structure 250A. Power supply node 222A, region 270A, and/or region 272A may operate as a base of parasitic bipolar structure 252A. In some examples, power supply node 210A may be electrically connected to power supply node 212A as shown in the top-view diagram of FIG. 2C. Thus, nodes 210A and 212A may be a single power supply node or nodes 210A and 212A may be electrically isolated. In some examples, node 210A may be electrically connected to node 212A, but nodes 210A and 212A may be distinct structures. Similarly, power supply node 220A may be electrically connected to power supply node 222A as shown in FIG. 2C.

Node 210A may be a first high-side power supply node, and node 212A may be a second high-side power supply node. Node 220A may be a first low-side power supply node, and node 222A may be a second low-side power supply node. Node 220A may be positioned between nodes 210A and 230. Node 222A may be positioned between nodes 212A and 230A. Power supply nodes 210A and 212A may each include an n-well, and region 272A may be a p-well that forms a p-region of parasitic structure 250A and 252A. Input-output node 230A and power supply nodes 210A and 212A may form the n-regions of parasitic structure 250A and 252A. A protection element that is configured to block the parasitic flow of positive carriers through parasitic structure 250A and 252A. The protection element may be integrated into device 200A or may be externally connected (e.g., to nodes 210A and 212A).

Input-output node 230A may include overvoltage ESD protection. Input-output node 230 may also have a high-absolute clamping voltage (e.g., more than five volts). The n-diffusion region is electrically connected to input-output node 230A may be susceptible to parasitic operation during ESD stress. The parasitic operation may include the parasitic flow of carriers through a n-p-n bipolar structure, such as bipolar structure 250A and/or 252A. Instead, if input-output node 230A is electrically connected to a p-diffusion region, the parasitic operation may include the parasitic flow of carriers through a p-n-p bipolar structure.

The diffusion region that is electrically connected to input-output node 230A can be part of the primary ESD protection and/or part of the active circuitry of the semiconductor device. Parasitic bipolar structures 250A and 252A may form between the diffusion region of input-output node 230A and the n-region of high-side power supply node 210A or 212A. The n-region of power supply nodes 210A and 212A may be configured to collect electrons in a guard-ring for latch-up protection. Guard ring 210B of FIG. 2B is an example of an n+ region that surrounds two or more side of device 200B and is electrically connected to a power supply node. The operation of bipolar structures 250A and 252A may be destructive to device 200A due to current filamentation.

The issues of parasitic flow can also occur for devices where power supply node 210A and 212A have p+ material. In such devices, the p+ material of nodes 210A, 212A, and 230A may include under-voltage (and/or high absolute clamping voltage) ESD protection. Power supply nodes 210A and 212A may be electrically connected to a low-side power supply such as $V_{SS}$, which may lead to parasitic p-n-p bipolar operation between node 230A and nodes 210A and 212A.

FIG. 2B shows an example device including guard ring 210B. Guard ring 210B may be an n-type isolation guard ring that is configured to collect carriers during a latch-up event. Guard ring 210B may include the high-side power supply nodes on the outside of device 200B (e.g., a first high-side power supply node and a second high-side power supply node). Guard ring 210B may at least partially encompass low-side power supply nodes 220B and 222B and input-output node 230. FIG. 2B depicts guard ring 210B partially encompassing nodes 220B, 222B, and 230 on three sides (e.g., both y-axis directions and the bottom z-axis direction). Guard ring 210B may also encompass nodes 220B, 222B, and 230 in one or both x-axis direction (not shown in FIG. 2B).

FIG. 2C shows a top-view diagram of device 200C, which may have a similar design as devices 200A and/or 200B. Input-output node 230 may be positioned in the center of device 200C, surrounded in the x-axis and y-axis directions by electrically insulating region 260. Power supply node 220 may surround electrically insulating region 260, and electrically insulating region 262 may surround power supply node 220. Power supply node 210, which may include an isolation guard ring, may surround electrically insulating region 262. Each of nodes 210, 220, and 230 may be configured to electrically connect to external devices or wires to transmit and receive signals. Cross section A-A may represent a view shown as device 200A in FIG. 2A and/or device 200B in FIG. 2B.

Figure 2D:
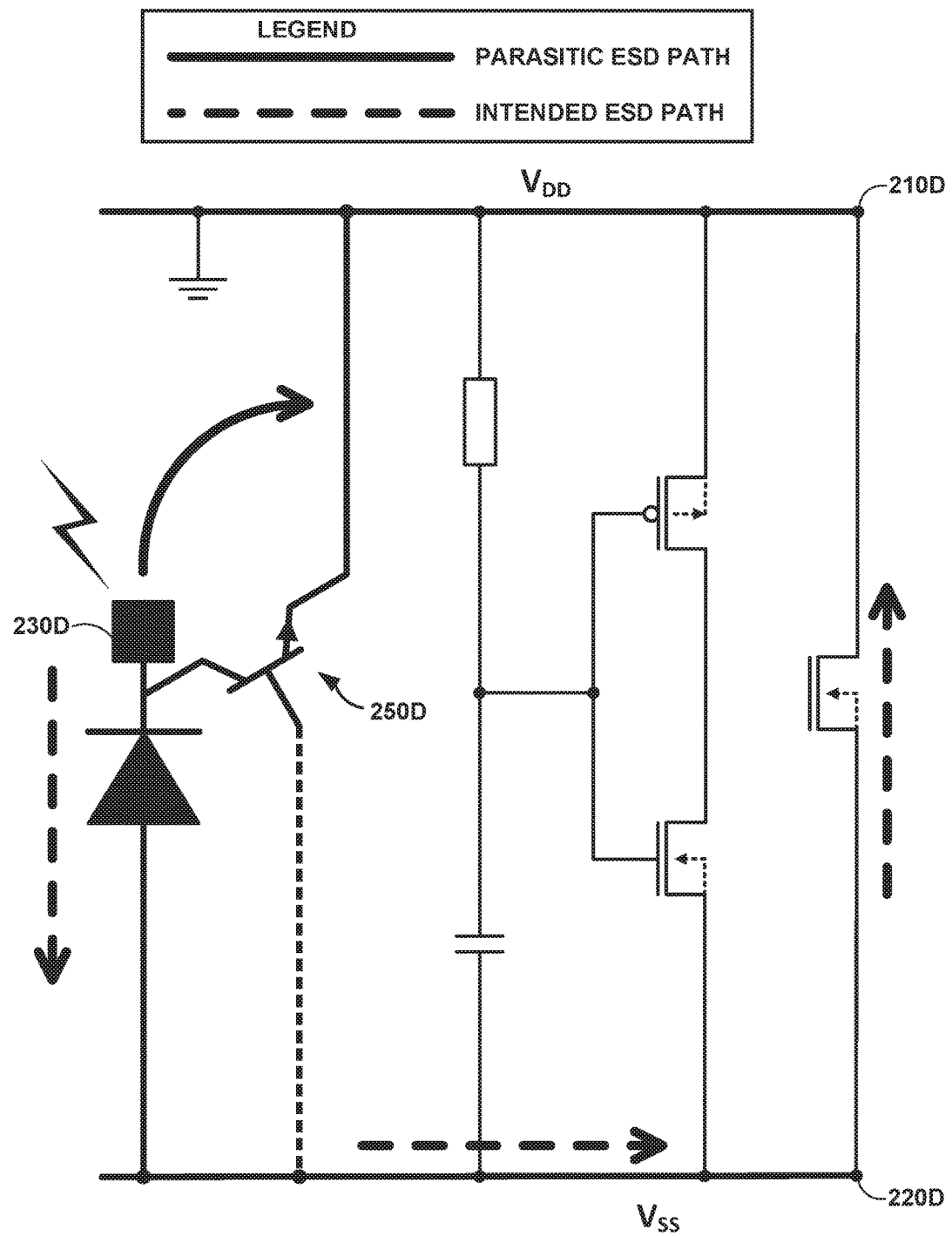
FIG. 2D is a circuit diagram illustrating parasitic flow from an input-output node to a power supply node, in accordance with some examples of this disclosure.

FIG. 2D is a circuit diagram illustrating parasitic flow from an input-output node 230D to a power supply node 210D, in accordance with some examples of this disclosure. During an ESD event, a current pulse (shown as a lightning bolt in FIG. 2D) may cause a parasitic flow of positive carriers through parasitic structure 250D to power supply node 210D. To prevent this parasitic flow, a protection element may be positioned between power supply node 210D and parasitic structure 250D to block the flow of positive carriers from input-output node 230D to power supply node 210D.

To test the ESD protection of a device, several hundred milliamperes of DC electricity may be injected into input-output node 230D. The injected current should not lead to parasitic thyristor triggering anywhere in the device. One technique for collecting the current is a guard ring (e.g., guard ring 210B depicted in FIG. 2B) to collect the current to prevent the carriers from distributing all over the device to harm components or trigger parasitic thyristor operation. In some examples, the ESD event may occur when the device is handled by a user, possibly before the device is powered on. When the device has not been powered on, the voltage level at high-side power supply node may be equal to reference ground.

Figure 3A:
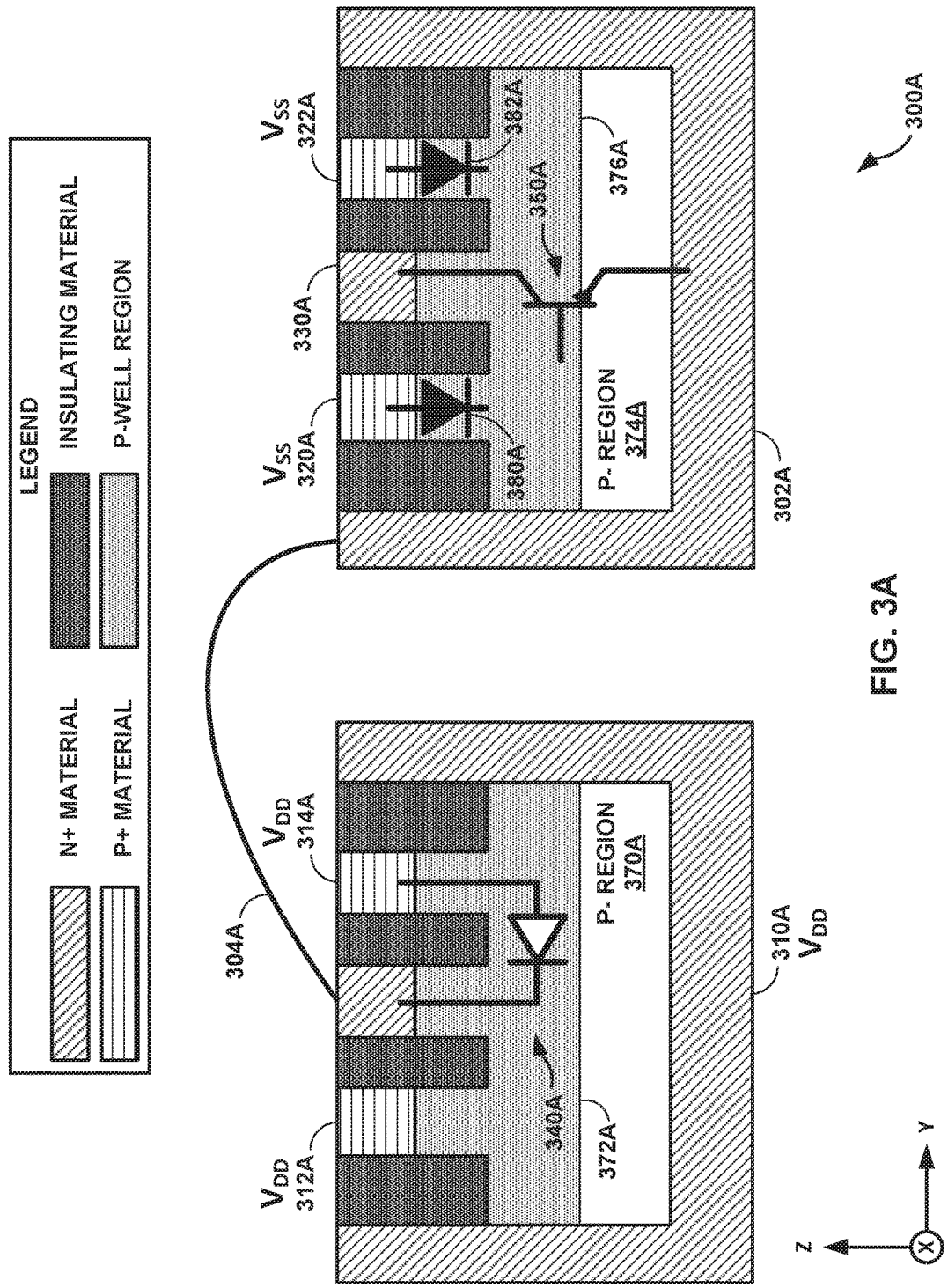
FIG. 3A illustrates a semiconductor device including a p-n diode configured to block parasitic flow, in accordance with some examples of this disclosure.

FIG. 3A illustrates a semiconductor device 300A including a p-n diode 340A configured to block parasitic flow, in accordance with some examples of this disclosure. FIG. 3A depicts side-by-side structures of device 300A, but the structures may also be positioned in series in the x-axis direction.

Diode 340A may be an anti-serial diode positioned between the input-output node 330A and power supply nodes 310A, 312A, and 314A. The primary ESD protection device may include one or more p-n diodes 380A and 382A formed by the n+ material of input-output node 330A and the p+ material of power supply nodes 320A and 322A. These diodes 380A and 382A may be in forward bias operation for negative stress and in avalanche operation for positive stress, e.g., when a current pulse causes the voltage level of input-output node 330A to increase. These p-n diodes 380A and 382A may be configured to block or impede the flow of positive carriers from input-output node 330A through guard ring 302A and electrical connection 304A to power supply nodes 320A and 322A. Diodes 380A and 382A could also be an n-type metal oxide semiconductor (NMOS) or any other protection device with an n-diffusion material connected to input-output node 330A.

Guard ring 302A may be configured to provide latch-up protection as a three-dimensional n-isolation region which surrounds p-well 376A, p-region 374A, and diodes 380A and 382A. The design of guard ring 302A may create a parasitic n-p-n bipolar structure 350A in the y-axis and z-axis directions. One design approach to reduce parasitic flow is to increase the lateral distance (e.g., y-axis direction) between input-output node 330A and guard ring 302A, but increasing the lateral distance may have little or no effect on the parasitic bipolar structure in the z-axis direction.

Anti-serial diode 340A may be positioned in a way that the anode is connected to a p+ region of power supply node 314A and the cathode is connected to the n-isolation region formed by electrical connection 304A and guard ring 302A, which may form the emitter region of parasitic bipolar structure 350A. N-p-n parasitic structure 350A may include an n-region of input-output node 330, an n-region of guard ring 302A, p-region 374A and p-well 376A. The flow through parasitic structure 350A may be based on Anti-serial diode 340A may include an n+/pw diode within isolation, a p+/nw diode, or any other type of diode available in a particular technology node. Parasitic n-p-n bipolar structure 350A may be able to conduct electricity from input-output node 330A to guard ring 302A because diode 340A may suppress the forward electrical current to one of power supply nodes 310A, 312A, and 314A until the breakdown voltage of diode 340A is reached. To maintain the electron collecting capability of diode 340A, the width of diode 340A should allow for the latch-up injection current (typically less than one hundred milliamperes DC) to be collected with a voltage drop of less than one volt.

Figure 3B:
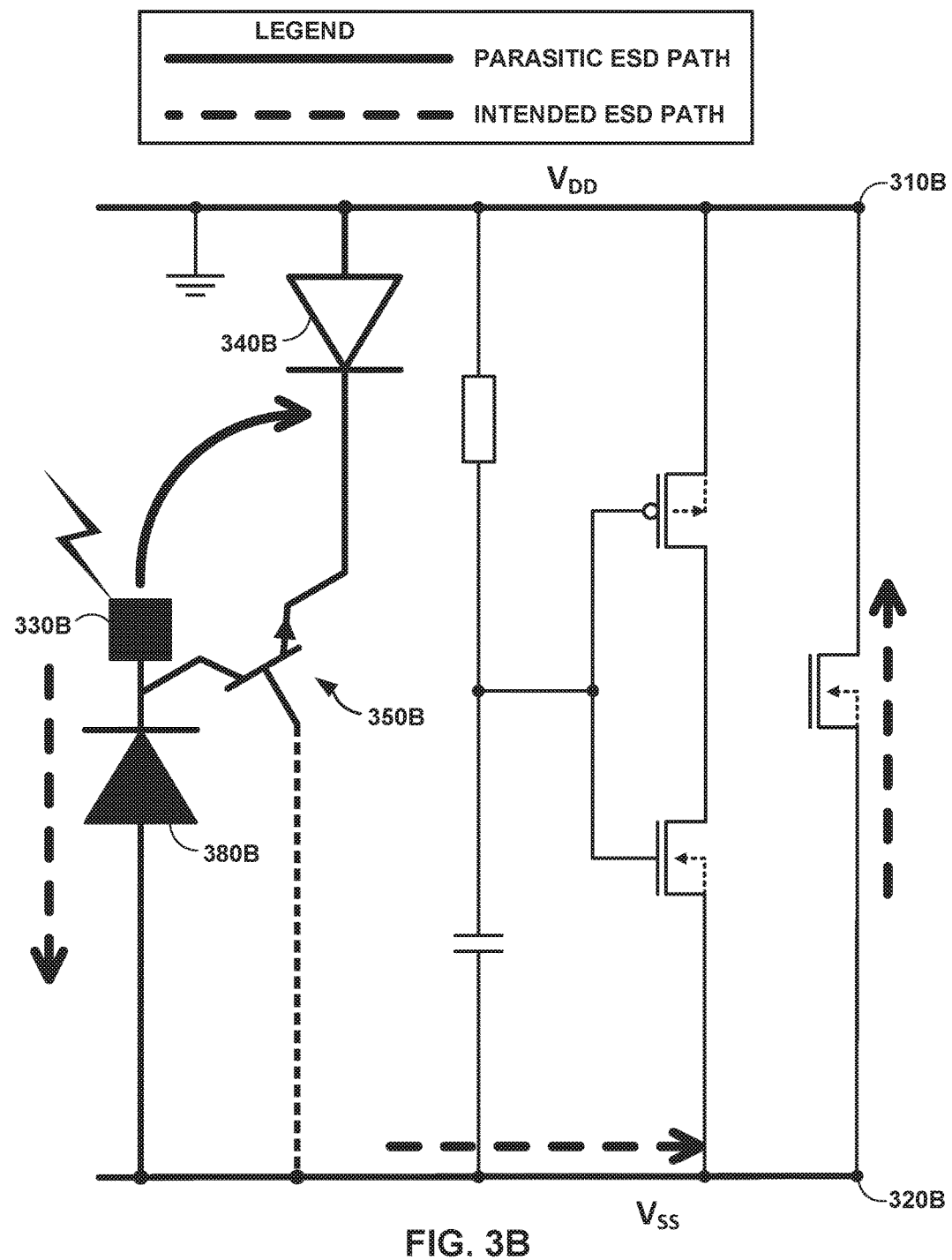
FIG. 3B is a circuit diagram illustrating a p-n diode configured to block parasitic flow from an input-output node to a power supply node, in accordance with some examples of this disclosure.
Figure 5:
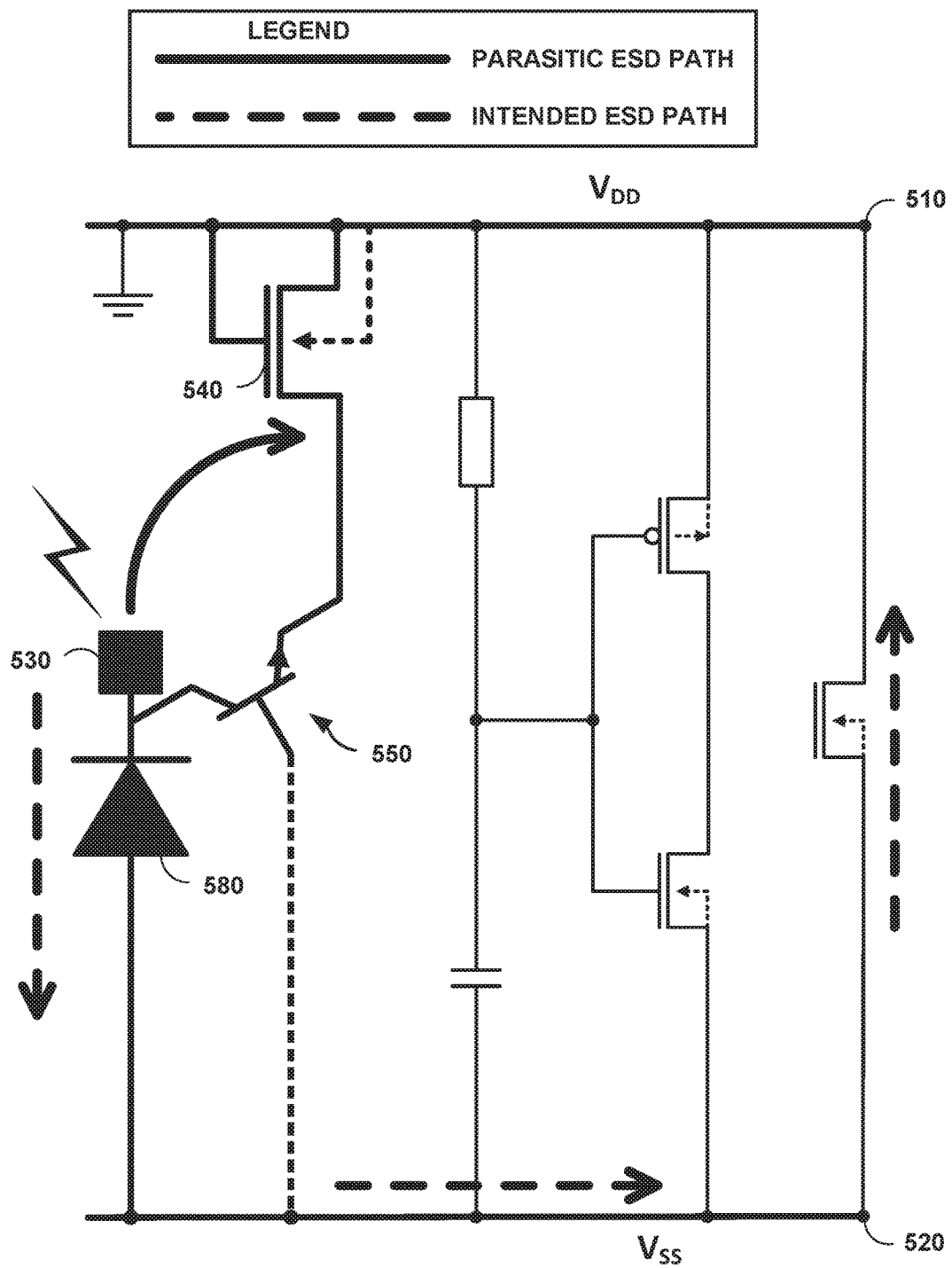
FIG. 5 is a circuit diagram illustrating a metal-oxide semiconductor transistor configured to block parasitic flow from an input-output node to a power supply node, in accordance with some examples of this disclosure.

FIG. 3B is a circuit diagram illustrating a p-n diode 340B configured to block parasitic flow from an input-output node 330B to a power supply node 310B, in accordance with some examples of this disclosure. During an ESD event, diode 340B may be configured to block positive carriers from flowing from input-output node 330B through parasitic bipolar structure 350B to power supply node 310B. The p-region of diode 340B may be electrically connected to power supply node 310B, and the n-region of diode 340B may be electrically connected to an n-type terminal of n-p-n parasitic structure 350B. Diodes 340A, 340B, 440B, 442B, 740, 840, and 842 are examples of passive protection elements of this disclosure, where MOS transistor 540 of FIG. 5 is an example of an active protection element.

Figure 4A:
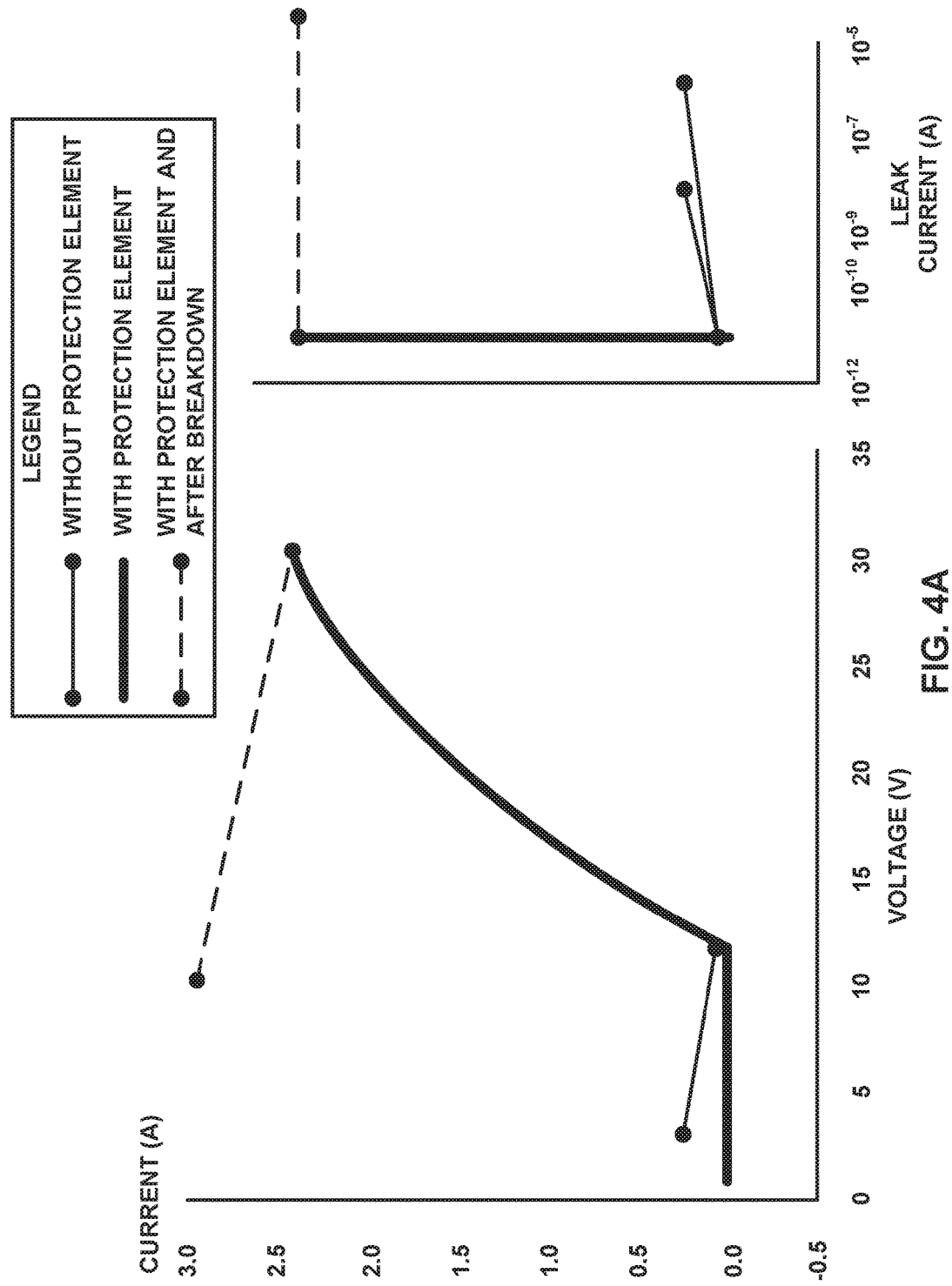
FIG. 4A shows a transmission line pulse trace of a test device with and without a protection element, in accordance with some examples of this disclosure.

FIG. 4A shows a transmission line pulse (TLP) trace of a test device with and without a protection element, in accordance with some examples of this disclosure. FIG. 4 depicts the ESD robustness effect of a protection element such as the anti-serial diode shown in FIGS. 3A and 3B. FIG. 4A shows a TLP measurement result of two test circuits, where one circuit has a protection element and the other circuit does not have a protection element. The tests involve stressing both circuits from an input-output node to a power supply node with positive polarity. The thin line with large endpoints shows the test circuit without a protection element. The parasitic flow through an n-p-n bipolar structure triggers and fails at very low current levels of around sixty milliamperes (corresponding to one hundred volts human body model (HBM). The heavy line shows the TLP trace of the same circuit with an anti-serial diode acting as a protection element to block parasitic flow of carriers. The failure current with the protection element drastically improves to approximately 2.4 amperes, which is the intrinsic failure limit of an avalanche diode.

Figure 4B:
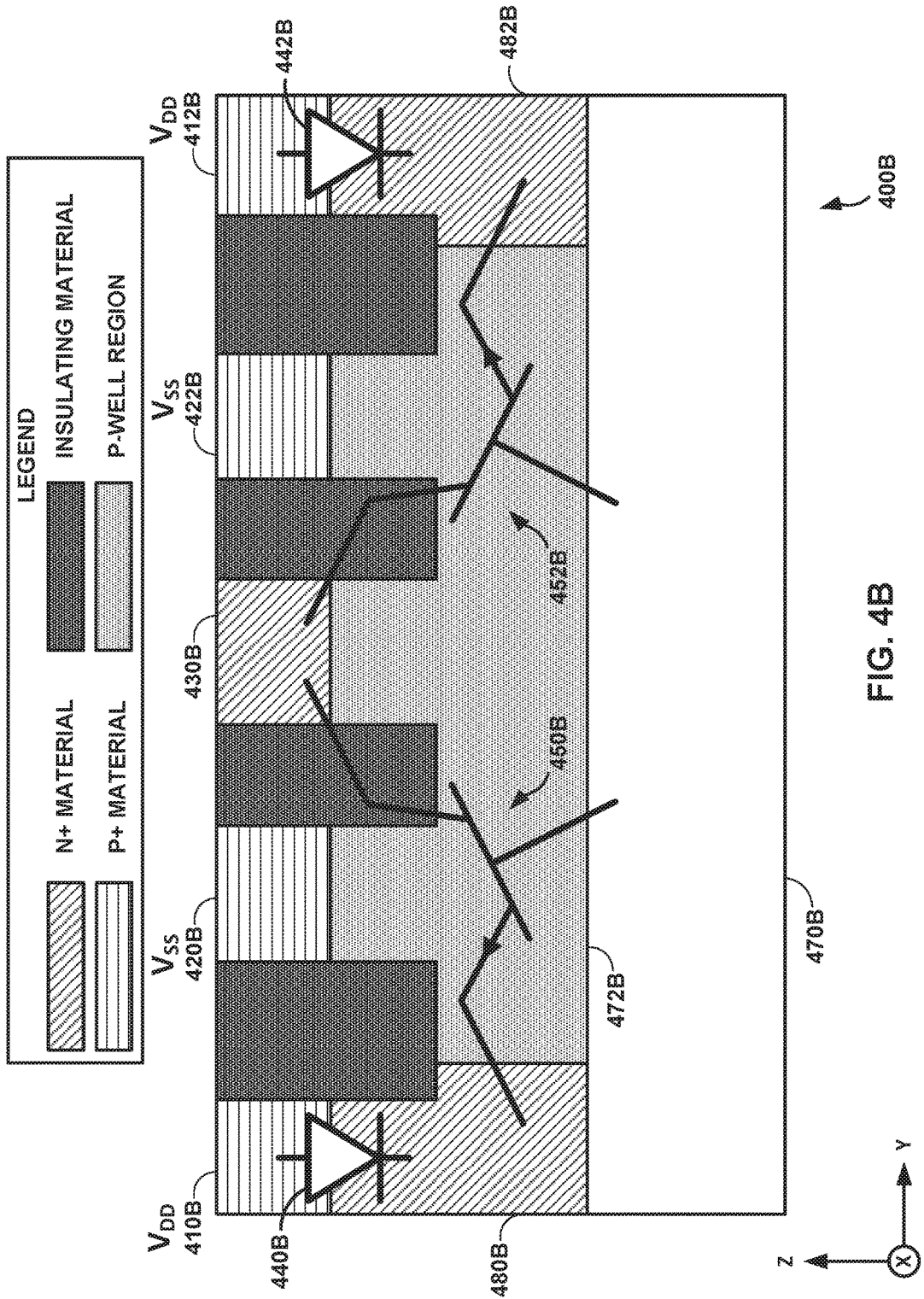
FIG. 4B illustrates a semiconductor device including a p-n diode configured to block parasitic flow between an input-output node and a power supply node, in accordance with some examples of this disclosure.

FIG. 4B illustrates a semiconductor device 400B including a p-n diode 440B and 442B configured to block parasitic flow between an input-output node 430B and two power supply nodes 410B and 412B, in accordance with some examples of this disclosure. Diodes 440B and 442B are examples of protection elements of this disclosure. Although FIG. 4B depicts two p-n diodes 440B and 442B, there may be only one diode because power supply node 410B may extend in the x-axis direction to connect to power supply node 412B. In addition, n-well 480B may extend in the x-axis direction to connect to n-well 482B. Therefore, n-p-n parasitic structures 450B and 452B may form a single n-p-n parasitic structure. Likewise, the side-view diagrams of FIGS. 2A, 2B, 3A, 4B, 6A, and 8 may include elements that extend in the x-axis directions to connect to symmetric elements.

Like device 300A, device 400B also employs anti-serial diode 440B and 442B to suppress n-p-n parasitic structures 450B and 452B where diode 440B and 442B is merged with the adjacent latch-up protecting n-region 480B and 482B. The latch-up protection or electron-collecting region 480B and 482B may be designed as a guard ring and not as a surrounding n-isolation region. This design arrangement may be more area-efficient than an additional anti-serial diode. This design arrangement may be feasible on a silicon die.

Diode 440B includes a p+ region 410B, which may function as a high-side power supply node. Diode 480B also includes n-well 480B, which may be form an end terminal of n-p-n parasitic structure 450B. N-p-n parasitic structure 450B may also include p-well 472B as a base terminal and input-output node 430B as the other end terminal. Diode 440B and 442B may be configured to block the parasitic flow of positive carriers from input-output node 430B through n-p-n parasitic structure 450B and 452B and n-well 480B and 482B to power supply nodes 410B and 412B.

FIG. 5 is a circuit diagram illustrating a MOS transistor 540 configured to block parasitic flow from an input-output node 530 to a power supply node 510, in accordance with some examples of this disclosure. MOS transistor 540 is an example of a protection element of this disclosure. MOS transistor 540 may be configured to conduct during normal operation when power supply node 510 receives a high-side power supply voltage although parasitic structure 550 may block the flow of positive carriers from power supply node 510 to input-output node 530.

MOS transistor 540 may be configured to be non-conducting during critical ESD stress paths, such as when power supply node 510 has a floating voltage or is grounded. The critical stress combination may occur when positive stress is applied to input-output node 530 with power supply node 510 electrically connected to reference ground. Where MOS transistor 540 is an NMOS switch with the gate and bulk (e.g., body) connected to power supply node 510, the switch is non-conducting. As an NMOS switch, MOS transistor 540 may include an isolation region (e.g., a three-dimensional region that partially encompasses a device) due to the bulk connection to high-side power supply node 510.

The width of MOS transistor 540 may be adapted to the latch-up guard-ring requirements. The saturation current should be in the range of one hundred milliamperes. Instead of an NMOS switch, protection element 540 may include a PMOS switch or a bipolar device. Moreover, MOS transistor 540 may include a dynamic gate or bulk control so that the switch does not conduct for the duration of an ESD event. MOS transistor 540 may be configured to block the parasitic flow of positive carriers from input-output node 530 through n-p-n parasitic structure 550 to power supply node 510.

FIG. 6A illustrates a semiconductor device 600A with parasitic flow between an input-output node 630A and a power supply node 610A and 612A, in accordance with some examples of this disclosure. Input-output node 630A may be configured to be under-voltage tolerant with a p-diffusion region. As compared to FIGS. 2A, 2B, 3A, and 4B, the positions of the high-side power supply nodes and the low-side power supply nodes may be switched. High-side power supply node 620A and 622A may be positioned between input-output node 630A and low-side power supply node 610A and 612A.

Each of nodes 610A, 612A, and 630A may include a p+ region. Nodes 620A and 622A may include an n+ region that is electrically connected to a high-side power supply. N-well 672A may separate input-output node 630A from power supply nodes 610A and 612A. Parasitic p-n-p bipolar transistor 650A and 652A can trigger during an ESD event in competition to the primary discharge path, which may be from input-output node 630A to power supply node 620A and 622A. As depicted in FIG. 6, this can happen when positive stress is applied to VSS while I/O is connected to tester ground.

Figure 6B:
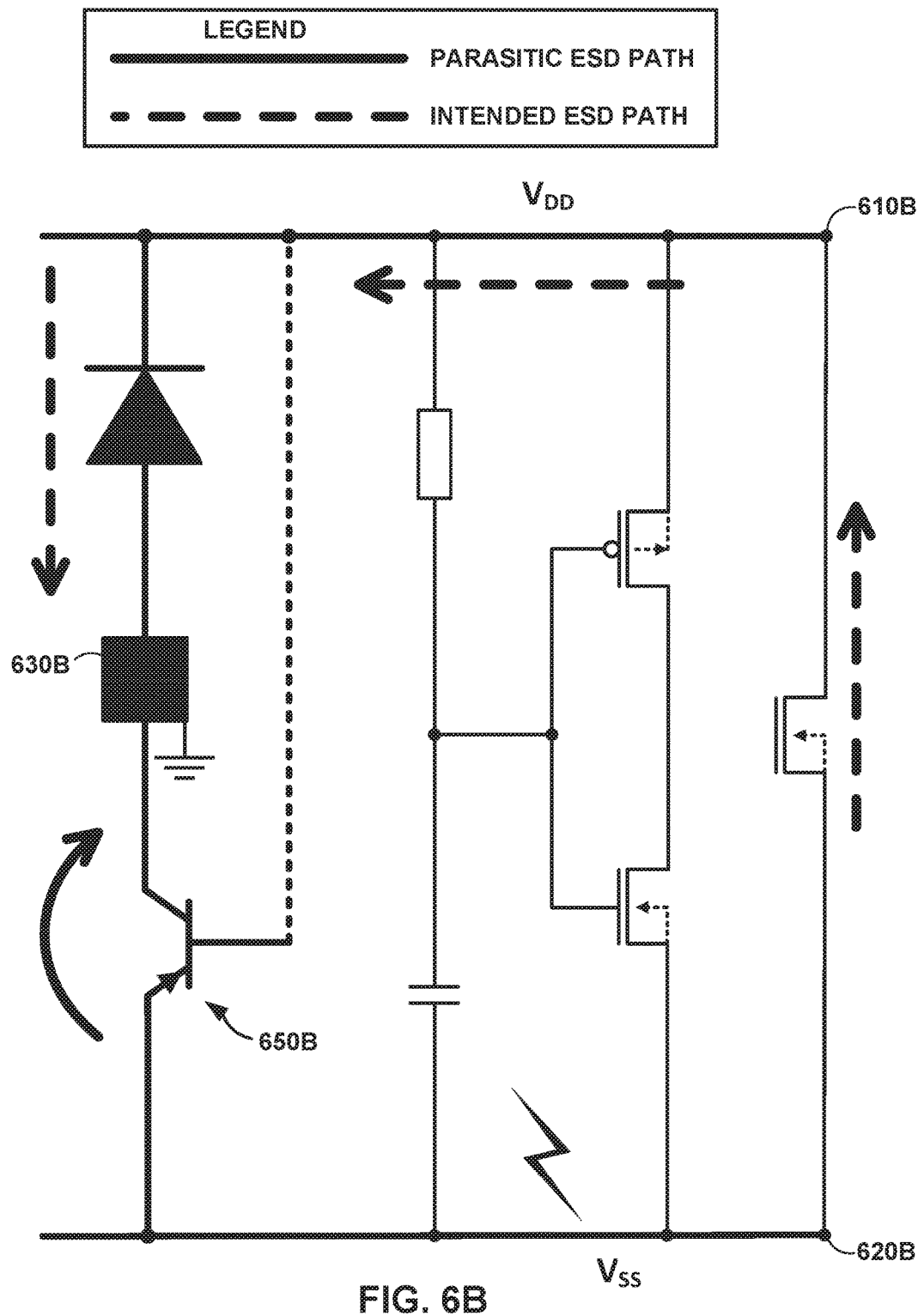
FIG. 6B is a circuit diagram illustrating parasitic flow from a power supply node to an input-output node, in accordance with some examples of this disclosure.

FIG. 6B is a circuit diagram illustrating parasitic flow from a power supply node 620B to an input-output node 630B, in accordance with some examples of this disclosure. Power supply node 620B may be electrically connected to a low-side power supply such as reference ground. When power supply node 620B experiences an ESD event, the intended current path is from power supply node 620B to power supply node 610B to input-output node 630B. However, parasitic bipolar structure 650B may provide a parasitic current path from power supply node 620B to input-output node 630B.

Figure 7:
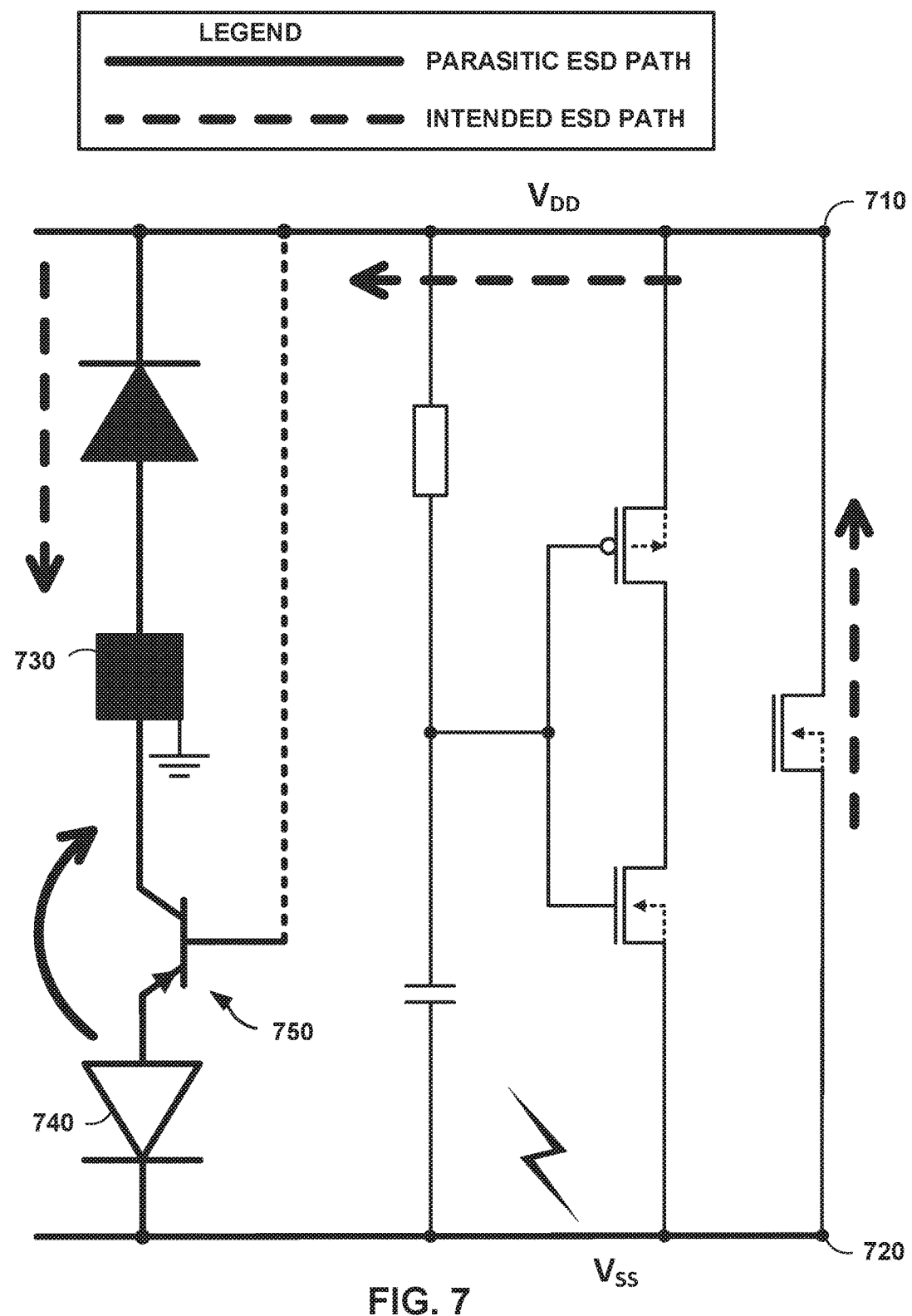
FIG. 7 is a circuit diagram illustrating a p-n diode configured to block parasitic flow from a power supply node to an input-output node, in accordance with some examples of this disclosure.

FIG. 7 is a circuit diagram illustrating a p-n diode 740 configured to block parasitic flow from a power supply node 720 to an input-output node 730, in accordance with some examples of this disclosure. Power supply node 720 may be electrically connected to a low-side power supply such as reference ground. Diode 740 may be configured to block the parasitic flow of positive carriers from power supply node 710 through n-p-n parasitic structure 750 to input-output node 730 and to block the parasitic flow of negative carriers from input-output node 730 through n-p-n parasitic structure 750 to power supply node 710.

To suppress the operation of p-n-p bipolar structure 750 during an ESD event, diode 740 is configured to block parasitic flow of positive carriers from power supply node 720 to input-output node 730. Diode 740 is an example of a protection element of this disclosure. Diode 740 may conduct electricity during normal operation of the device, although parasitic structure 750 may block the flow of positive carriers from input-output node 730 to power supply node 720. However, diode 740 may not conduct electricity during an ESD event. Diode 740 may be positioned between the emitter of p-n-p bipolar structure 750 and power supply node 720.

Diode 740 may be an external anti-serial diode (e.g., a n+/pw diode in isolation), an integrated diode (e.g., diode 840 and 842 in FIG. 8), or any other type of switch. Diode 740 may function as a high-ohmic connection between nodes 720 and 730 during an ESD event. During normal operation, diode 740 may function as a low-ohmic connection with respect to the collection of positive carriers between nodes 720 and 730.

Figure 8:
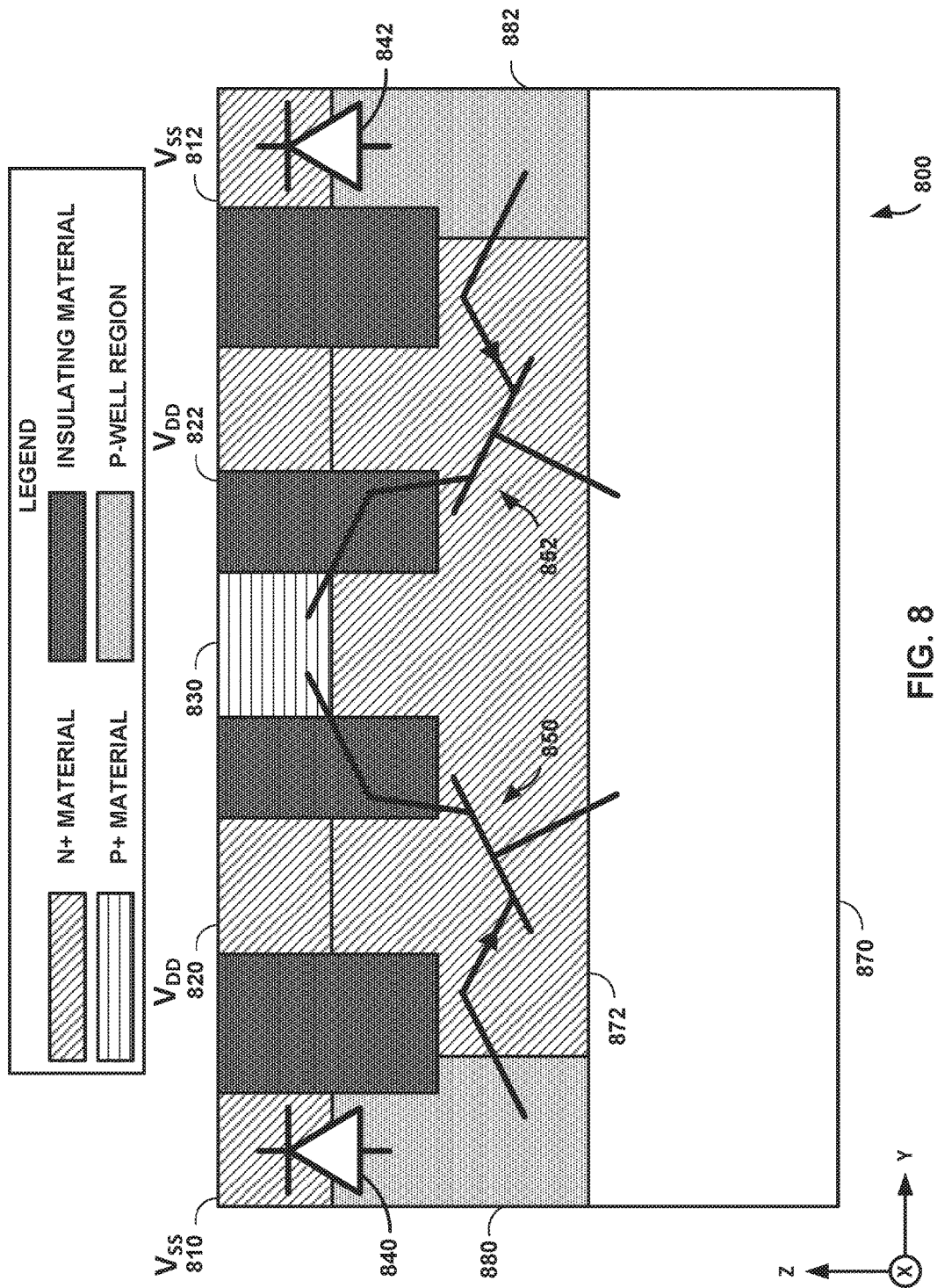
FIG. 8 illustrates a semiconductor device including a p-n diode configured to block parasitic flow between an input-output node and a power supply node, in accordance with some examples of this disclosure.

FIG. 8 illustrates a semiconductor device including a p-n diode 840 and 842 configured to block parasitic flow between an input-output node 830 and a power supply node 810 and 812, in accordance with some examples of this disclosure. Diode 840 and 842 may be a passive switching element configured to block the parasitic flow of negative carriers from input-output node 830 through n-p-n parasitic structure 850 to power supply node 810. In some examples, an external active protection element such as a MOS transistor may be electrically connected to low-side power supply nodes 810 and 812 and configured to block the parasitic flow of negative carriers from input-output node 830 to power supply nodes 810 and 812.

P-well 880 and 882 may form the p-type material of diode 840 and 842 and a first p-region of p-n-p parasitic structure 850 and 852. Low-side power supply node 810 and 812 ($V_{SS}$) may form the n-type material of diode 840 and 842. Input-output node 830 may form a second p-region of p-n-p parasitic structure 850 and 852. Power supply node 820 may be positioned between nodes 810 and 830, and power supply node 822 may be positioned between nodes 812 and 830. In some examples, device 800 may include an isolation guard ring, similar to the guard rings of devices 200B and 300A, that at least partially encompasses nodes 820, 822, and 830.

Figure 9:
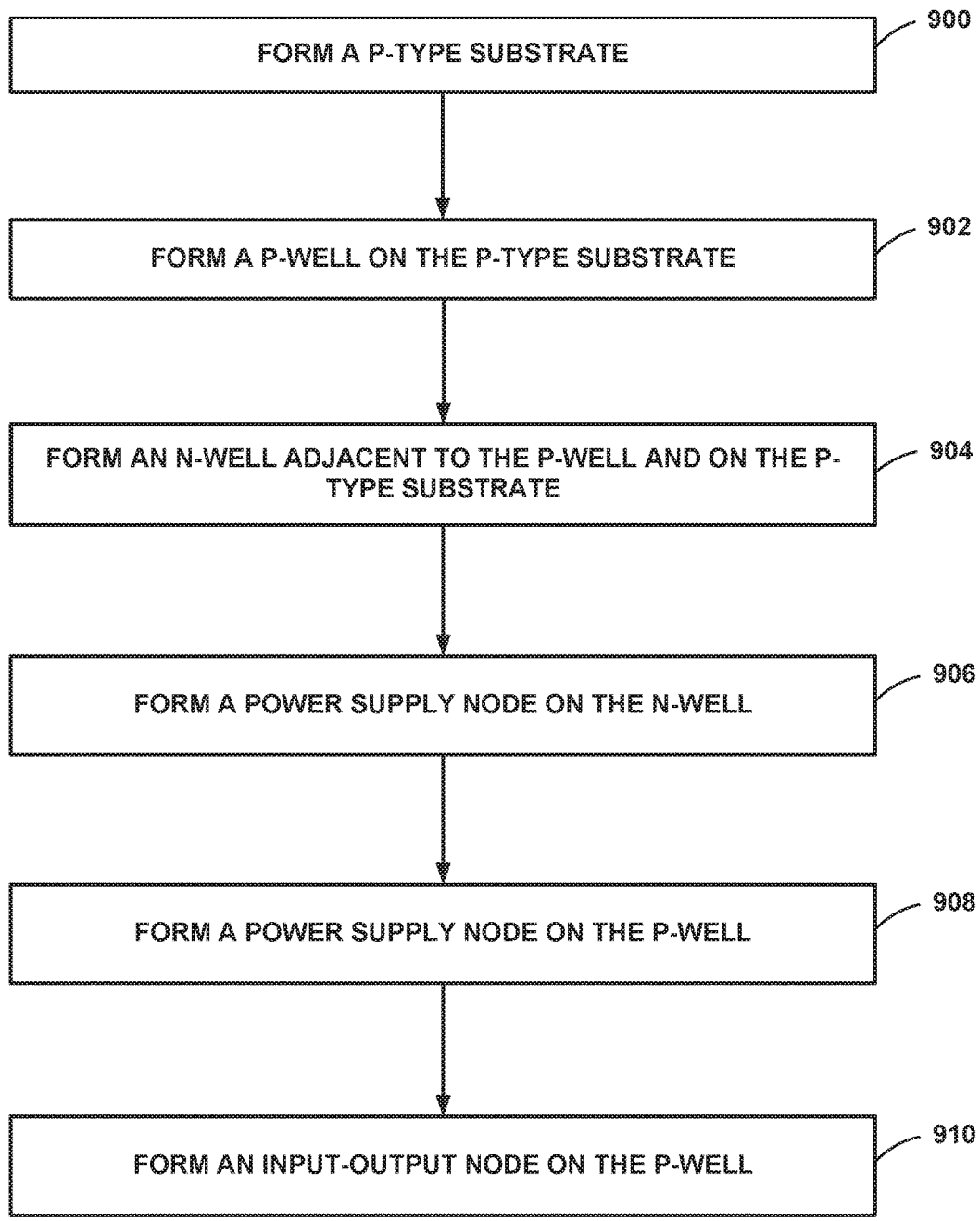
FIG. 9 is a flowchart illustrating example techniques for constructing a semiconductor device configured to block parasitic flow between an input-output node and a power supply node, in accordance with some examples of this disclosure.

FIG. 9 is a flowchart illustrating example techniques for constructing a semiconductor device configured to block parasitic flow between an input-output node and a power supply node, in accordance with some examples of this disclosure. The techniques of FIG. 9 are described with reference to device 400B in FIG. 4B, although other components, such as the devices in FIGS. 1-3B and 5-8, may exemplify similar techniques.

The technique of FIG. 9 includes forming p-type substrate 470B (900) and forming p-well 472B on p-type substrate 470B (902). P-type substrate 470B may include relatively lightly doped p-type semiconductor material. P-well 472B may include relatively highly doped p-type semiconductor material. The technique of FIG. 9 also includes forming n-well 480B and 482B adjacent to p-well 472B on p-type substrate 470B (904). N-well 480B and 482B may include relatively highly doped n-type semiconductor material. Although depicted in FIG. 4B as two structures, n-well 480B and 482B may be a single n-well structure that extends into and/or out of the page in the x-axis direction.

The technique of FIG. 9 also includes forming power supply node 410B on n-well 480B, where forming power supply node 410B comprises forming p-type material on n-well 410B (906). Although depicted in FIG. 4B as two structures, power supply node 410B and 412B may be a single structure that extends into and/or out of the page in the x-axis direction. Power supply node 410B and 412B may form the p-type material of diode 440B and 442B, and n-well 480B and 482B may form the n-type material of diode 440B and 442B. Diode 440B and 442B may be configured to block the parasitic flow of positive carriers from p-well 472B to power supply node 410B and 412B.

The technique of FIG. 9 also includes forming power supply node 420B and 422B on p-well 472B, wherein forming power supply node 420B and 422B comprises forming p-type material on p-well 472B (908). Although depicted in FIG. 4B as two structures, power supply node 420B and 422B may be a single structure that extends into and/or out of the page in the x-axis direction.

The technique of FIG. 9 also includes forming input-output node 430B on p-well 472B, wherein forming input-output node 430B comprises forming n-type material on p-well 472B (910). Input-output node 430B may form an n-type material of n-p-n parasitic bipolar structure 450B and 452B. During an ESD event, a current pulse at input-output node 430 could result in the parasitic flow of positive carriers from input-output node 430 through p-well 472B to n-well 480B and 482B. The parasitic flow may be based on the voltage level of power supply node 420B and 422B.

The technique of FIG. 9 may also be applied to device 800 of FIG. 8, which may provide under-voltage protection. For example, the technique of FIG. 9 includes forming p-type substrate 870 (900) and forming n-well 872 on p-type substrate 870 (902). P-type substrate 870 may include relatively lightly doped p-type semiconductor material. N-well 872 may include relatively highly doped n-type semiconductor material. The technique of FIG. 9 also includes forming p-well 880 and 882 adjacent to n-well 872 on p-type substrate 870 (904). P-well 880 and 882 may include relatively highly doped p-type semiconductor material. Although depicted in FIG. 8 as two structures, p-well 880 and 882 may be a single p-well structure that extends into and/or out of the page in the x-axis direction.

The technique of FIG. 9 also includes forming power supply node 810 on p-well 880, where forming power supply node 810 comprises forming n-type material on p-well 810 (906). Although depicted in FIG. 8 as two structures, power supply node 810 and 812 may be a single structure that extends into and/or out of the page in the x-axis direction. Power supply node 810 and 812 may form the n-type material of diode 840 and 842, and p-well 880 and 882 may form the p-type material of diode 840 and 842. Diode 840 and 842 may be configured to block the parasitic flow of negative carriers from n-well 872 to power supply node 810 and 812.

The technique of FIG. 9 also includes forming power supply node 820 and 822 on n-well 872, wherein forming power supply node 820 and 822 comprises forming n-type material on n-well 872 (908). Although depicted in FIG. 8 as two structures, power supply node 820 and 822 may be a single structure that extends into and/or out of the page in the x-axis direction.

The technique of FIG. 9 also includes forming input-output node 830 on p-well 872, wherein forming input-output node 830 comprises forming p-type material on n-well 872 (910). Input-output node 830 may form a p-type material of p-n-p parasitic bipolar structure 850 and 852. During an ESD event, a current pulse at input-output node 830 could result in the parasitic flow of negative carriers from input-output node 830 through n-well 872 to p-well 880 and 882. The parasitic flow may be based on the voltage level of power supply node 820 and 822. However, diode 840 and 842 may be configured to block the parasitic flow of negative carriers from input-output node 830 to power supply node 810 and 812.

Figure 10:
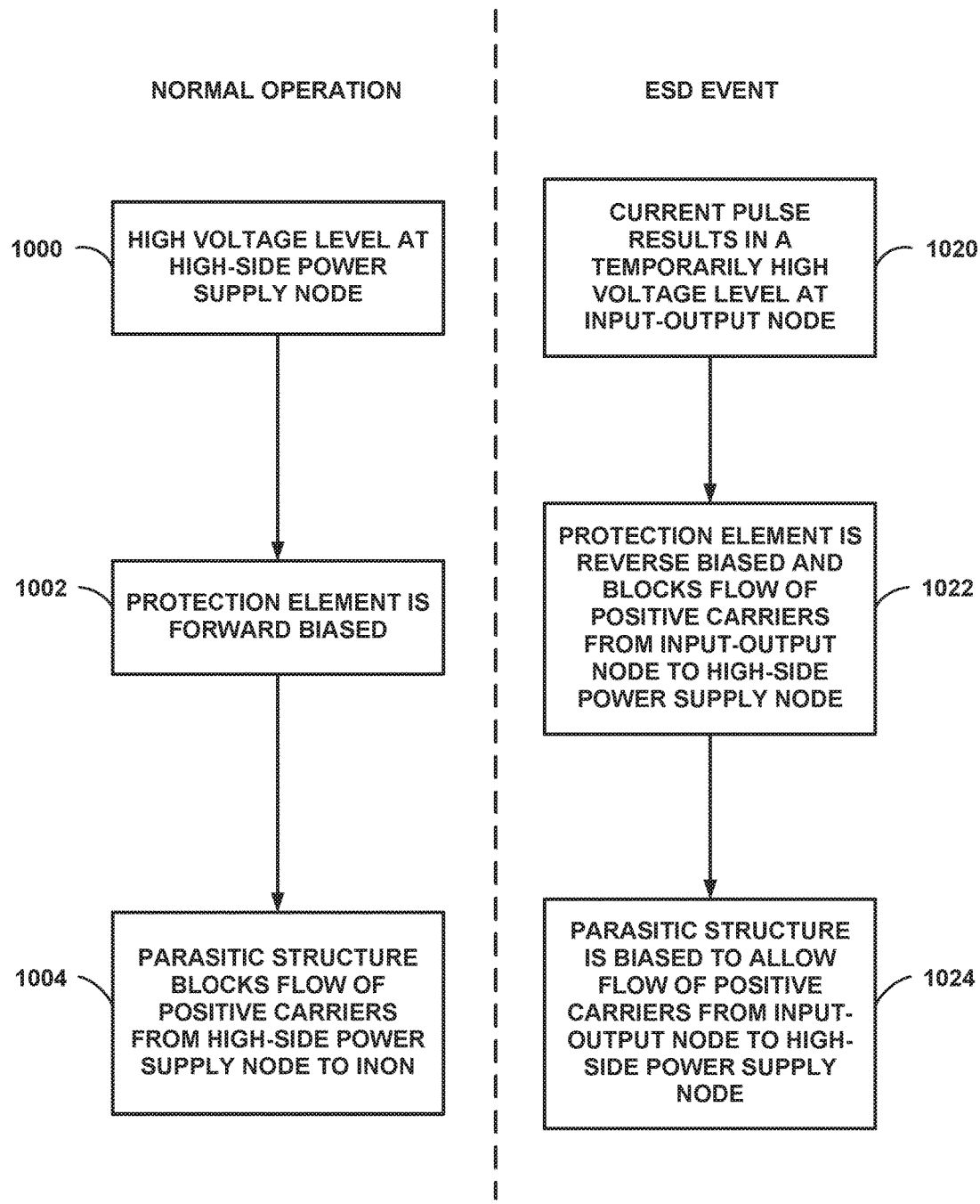
FIG. 10 is a side-by-side flowchart illustrating the operation of a protection element and a parasitic structure during normal operation and an electrostatic discharge (ESD) event.

FIG. 10 is a side-by-side flowchart illustrating the operation of a protection element and a parasitic structure during normal operation and an ESD event. The techniques of FIG. 10 are described with reference to device 400B in FIG. 4B, although other components, such as the devices in FIGS. 1-3B and 5-8, may exemplify similar techniques.

During normal operation, power supply node 410B may have a high voltage level (1000). The high voltage level may be three volts, five volts, ten volts, tens of volts, hundreds of volts, or more than one thousand volts higher than the voltage level of power supply node 420B. The high voltage level at power supply node 410B may cause protection element 440B to be forward biased (1002) because the p-type region of protection element 440B may be electrically connected to power supply node 410B. However, parasitic structure 450B may be configured to block the flow of positive carriers from power supply node 410B to input-output node 430B (1004).

During an ESD event, input-output node 430B may experience a current pulse that results in a temporarily high voltage level (1020). During the ESD event, input-output node 430B may have a voltage level that is higher than the voltage level of power supply node 410B, causing protection element 440B to be reverse biased (1022). Although parasitic structure 450B is biased to allow the flow of positive carriers from power supply node 410B to input-output node 430B (1024).

The following numbered examples demonstrate one or more aspects of the disclosure.

Example 1

A device includes a first power supply node, an input-output node, and a second power supply node positioned between the first power supply node and the input-output node. The device also includes a protection element configured to block a parasitic flow of carriers between the first power supply node and the input-output node, wherein the parasitic flow of carriers is based on a voltage level of the second power supply node.

Example 2

The device of example 1, wherein the protection element is configured to block the parasitic flow of positive carriers from the input-output node to the first power supply node.

Example 3

The device of examples 1-2 or any combination thereof, wherein the protection element is configured to block the parasitic flow of positive carriers through an n-p-n parasitic structure from the input-output node to the first power supply node. A first n-region of the n-p-n parasitic structure comprises the input-output node. In addition, a second n-region of the n-p-n parasitic structure is connected to an n-type material of the p-n diode.

Example 4

The device of examples 1-3 or any combination thereof, wherein the protection element comprises a p-n diode, and a p-type material of the p-n diode comprises is connected to the first power supply node. An n-region of the p-n diode is connected to the second n-region of the n-p-n parasitic structure.

Example 5

The device of examples 1-4 or any combination thereof, wherein the protection element comprises an active protection element configured to block the parasitic flow of positive carriers from the input-output node to the first power supply node.

Example 6

The device of examples 1-5 or any combination thereof, wherein the active protection element comprises a metal-oxide-semiconductor transistor configured to block the parasitic flow of positive carriers from the input-output node to the first power supply node.

Example 7

The device of examples 1-6 or any combination thereof, wherein the first power supply node is a first high-side power supply node, and wherein the second power supply node is a first low-side power supply node.

Example 8

The device of examples 1-7 or any combination thereof, further including a second high-side power supply node and a second low-side power supply node positioned between the second high-side power supply node and the input-output node.

Example 9

The device of examples 1-8 or any combination thereof, further including an n-type isolation guard ring including the first high-side power supply node and the second high-side power supply node. The n-type isolation guard ring at least partially encompasses the first low-side power supply node, the second low-side power supply node, and the input-output node.

Example 10

The device of examples 1-9 or any combination thereof, wherein the first high-side power supply node comprises a first n-well, and the second high-side power supply node comprises a second n-well. The device further includes a p-well adjacent to the first n-well, the second n-well, the first low-side power supply node, the second low-side power supply node, and the input-output node. The protection element is configured to block the parasitic flow of positive carriers through an n-p-n parasitic structure, and a p-region of the n-p-n parasitic structure comprises the p-well.

Example 11

The device of examples 1-10 or any combination thereof, wherein the protection element is configured to block the parasitic flow of negative carriers from the first power supply node to the input-output node.

Example 12

The device of examples 1-11 or any combination thereof, wherein the protection element includes a p-n diode, and an n-type material of the p-n diode includes the first power supply node.

Example 13

The device of examples 1-12 or any combination thereof, wherein the protection element is configured to block the parasitic flow of positive negative carriers through a p-n-p parasitic structure from the first power supply node to the input-output node. A first p-region of the p-n-p parasitic structure includes the input-output node, and a second p-region of the p-n-p parasitic structure includes a p-type material of the p-n diode.

Example 14

The device of examples 1-13 or any combination thereof, wherein the protection element includes an active protection element configured to block the parasitic flow of negative carriers from the first power supply node to the input-output node.

Example 15

The device of examples 1-14 or any combination thereof, wherein the active protection element includes a metal-oxide-semiconductor transistor configured to block the parasitic flow of negative carriers from the first power supply node to the input-output node.

Example 16

The device of examples 1-15 or any combination thereof, wherein the first power supply node is a first low-side power supply node, and wherein the second power supply node is a first high-side power supply node.

Example 17

The device of examples 1-16 or any combination thereof, further including a second low-side power supply node and a second high-side power supply node positioned between the second low-side power supply node and the input-output node.

Example 18

The device of examples 1-17 or any combination thereof, further including an p-type isolation guard ring including the first low-side power supply node and the second low-side power supply node. The p-type isolation guard ring at least partially encompasses the first high-side power supply node, the second high-side power supply node, and the input-output node.

Example 19

The device of examples 1-18 or any combination thereof, wherein the first low-side power supply node is adjacent to a first p-well, and the second low-side power supply node is adjacent to a second p-well. The device further includes a n-well adjacent to the first p-well, the second p-well, the first high-side power supply node, the second high-side power supply node, and the input-output node. The protection element is configured to block the parasitic flow of positive negative carriers through a p-n-p parasitic structure. A first p-region of the p-n-p parasitic structure includes the input-output node, and a second p-region of the p-n-p parasitic structure includes the first p-well or the second p-well. An n-region of the p-n-p parasitic structure includes the n-well.

Example 20

A method includes forming a p-type substrate, forming a p-well on the p-type substrate, and forming an n-well adjacent to the p-well on the p-type substrate. The method also includes forming a first power supply node on the n-well, wherein forming the first power supply node comprises forming p-type material on the n-well. The method further includes forming a second power supply node on the p-well, wherein forming the second power supply node comprises forming p-type material on the p-well. The method includes forming an input-output node on the p-well, wherein forming the input-output node comprises forming n-type material on the p-well.

Various examples of the disclosure have been described. Any combination of the described systems, operations, or functions is contemplated. These and other examples are within the scope of the following claims.

What is claimed is:

1. A device comprising:
a first power supply node;
an input-output node;
a second power supply node positioned between the first power supply node and the input-output node; and
a protection element configured to block a parasitic flow of positive carriers through an n-p-n parasitic structure from the input-output node to the first power supply node,
wherein the parasitic flow of positive carriers is based on a voltage level of the second power supply node,
wherein a first n-region of the n-p-n parasitic structure comprises the input-output node, and
wherein a second n-region of the n-p-n parasitic structure is electrically connected to an n-type material of the protection element.

2. The device of claim 1,
wherein the protection element comprises a p-n diode,
wherein a p-type material of the p-n diode is electrically connected to the first power supply node, and
wherein a n-type material of the p-n diode is electrically connected to the second n-region of the n-p-n parasitic structure.

3. The device of claim 1, wherein the protection element comprises an active protection element configured to block the parasitic flow of positive carriers from the input-output node to the first power supply node.

4. The device of claim 3, wherein the active protection element comprises a metal-oxide-semiconductor transistor configured to block the parasitic flow of positive carriers from the input-output node to the first power supply node.

5. The device of claim 1, wherein the first power supply node is a first high-side power supply node, and wherein the second power supply node is a first low-side power supply node.

6. The device of claim 5, further comprising:
a second high-side power supply node; and
a second low-side power supply node positioned between the second high-side power supply node and the input-output node.

7. The device of claim 6, further comprising an n-type isolation guard ring including the first high-side power supply node and the second high-side power supply node, wherein the n-type isolation guard ring at least partially encompasses the first low-side power supply node, the second low-side power supply node, and the input-output node.

8. The device of claim 6,
wherein the first high-side power supply node comprises a first n-well,
wherein the second high-side power supply node comprises a second n-well that is electrically connected to the first n-well,
wherein the device further comprises a p-well adjacent to the first n-well, the second n-well, the first low-side power supply node, the second low-side power supply node, and the input-output node, and
wherein a p-region of the n-p-n parasitic structure comprises the p-well.

9. A method comprising:
forming a p-type substrate;
forming a p-well on the p-type substrate;
forming an n-well adjacent to the p-well on the p-type substrate;
forming a first power supply node on the n-well, wherein forming the first power supply node comprises forming p-type material on the n-well;
forming a second power supply node on the p-well, wherein the second power supply node is positioned between the first power supply node and the input-output node, and wherein forming the second power supply node comprises forming p-type material on the p-well;
forming an input-output node on the p-well, wherein forming the input-output node comprises forming n-type material on the p-well;
forming an n-p-n parasitic structure comprising a first n-region and a second n-region, wherein the first n-region comprises the input-output node; and forming a protection element to block a parasitic flow of positive carriers through the n-p-n parasitic structure from the input-output node to the first power supply node, wherein the second n-region is electrically connected to an n-type material of the protection element, and wherein the parasitic flow of positive carriers is based on a voltage level of the second power supply node.

10. The method of claim 9, wherein forming the protection element comprises forming a p-n diode, wherein a p-type material of the p-n diode is electrically connected to the first power supply node, and wherein a n-type material of the p-n diode is electrically connected to the second n-region of the n-p-n parasitic structure.

11. The method of claim 9, wherein forming the protection element comprises forming a metal-oxide-semiconductor transistor to block the parasitic flow of positive carriers from the input-output node to the first power supply node.

12. The method of claim 9, wherein the first power supply node is a first high-side power supply node, and wherein the second power supply node is a first low-side power supply node, the method further comprising:

forming a second high-side power supply node; and forming a second low-side power supply node positioned between the second high-side power supply node and the input-output node.

13. A device comprising:

a first power supply node;

an input-output node;

a second power supply node positioned between the first power supply node and the input-output node; and a protection element configured to block a parasitic flow of negative carriers through a p-n-p parasitic structure from the input-output node to the first power supply node, wherein the parasitic flow of negative carriers is based on a voltage level of the second power supply node, wherein a first p-region of the p-n-p parasitic structure comprises the input-output node, and wherein a second p-region of the p-n-p parasitic structure is electrically connected to a p-type material of the protection element.

14. The device of claim 13, wherein the protection element comprises a p-n diode, wherein a n-type material of the p-n diode comprises the first power supply node, and wherein a p-type material of the p-n diode is electrically connected to the second p-region of the p-n-p parasitic structure.

15. The device of claim 13, wherein the protection element comprises an active protection element configured to block the parasitic flow of negative carriers from the first power supply node to the input-output node.

16. The device of claim 15, wherein the active protection element comprises a metal-oxide-semiconductor transistor configured to block the parasitic flow of negative carriers from the first power supply node to the input-output node.

17. The device of claim 13, wherein the first power supply node is a first low-side power supply node, and wherein the second power supply node is a first high-side power supply node.

18. The device of claim 17, further comprising:

a second low-side power supply node; and a second high-side power supply node positioned between the second low-side power supply node and the input-output node.

19. The device of claim 18, further comprising an p-type isolation guard ring including the first low-side power supply node and the second low-side power supply node, wherein the p-type isolation guard ring at least partially encompasses the first high-side power supply node, the second high-side power supply node, and the input-output node.

20. The device of claim 18, wherein the first low-side power supply node is adjacent to a first p-well, wherein the second low-side power supply node is adjacent to a second p-well, wherein the device further comprises a n-well adjacent to the first p-well, the second p-well, the first high-side power supply node, the second high-side power supply node, and the input-output node, wherein a second p-region of the p-n-p parasitic structure comprises the first p-well or the second p-well, and wherein an n-region of the p-n-p parasitic structure comprises the n-well.

* * * * *